United States Patent
Ariyama (10) Patent No.: US 10,088,532 B2
(45) Date of Patent: Oct. 2, 2018

(54) TEMPERATURE COMPENSATION CIRCUIT AND SENSOR DEVICE

(71) Applicant: SII Semiconductor Corporation, Chiba-shi, Chiba (JP)

(72) Inventor: Minoru Ariyama, Chiba (JP)

(73) Assignee: ABLIC INC., Chiba (JP)

(*) Notice: Subject to any disclaimer, the term of this patent is extended or adjusted under 35 U.S.C. 154(b) by 45 days.

(21) Appl. No.: 15/165,445

(22) Filed: May 26, 2016

(65) Prior Publication Data
US 2016/0356862 A1    Dec. 8, 2016

(30) Foreign Application Priority Data

Jun. 2, 2015  (JP) ................................ 2015-112309

(51) Int. Cl.
| | |
|---|---|
| G05D 23/24 | (2006.01) |
| G01R 33/00 | (2006.01) |
| H03K 17/14 | (2006.01) |
| G01R 33/07 | (2006.01) |

(52) U.S. Cl.
CPC ......... G01R 33/0082 (2013.01); G01R 33/07 (2013.01); H03K 17/14 (2013.01)

(58) Field of Classification Search
CPC ....... G01L 1/2281; G01L 9/065; G01L 19/04; G01D 3/0365; G05D 23/24
See application file for complete search history.

(56) References Cited

U.S. PATENT DOCUMENTS

| | | | | | |
|---|---|---|---|---|---|
| 4,143,549 | A | * | 3/1979 | Koehler | G01K 3/14 374/114 |
| 4,359,685 | A | * | 11/1982 | Eguchi | G01D 5/145 324/174 |
| 5,187,985 | A | * | 2/1993 | Nelson | G01L 1/2281 338/3 |
| 5,253,532 | A | * | 10/1993 | Kamens | G01L 9/065 374/143 |
| 5,402,064 | A | * | 3/1995 | Eck | G01R 33/09 324/207.12 |
| 5,953,173 | A | * | 9/1999 | Klaassen | G11B 5/02 360/66 |
| 6,724,202 | B2 | * | 4/2004 | Tanizawa | G01D 3/0365 324/71.1 |

(Continued)

OTHER PUBLICATIONS

Extended European Search Report in corresponding European Application No. 16172517.1, dated Oct. 7, 2016, 10 pages.

*Primary Examiner* — Alesa Allgood
(74) *Attorney, Agent, or Firm* — Brinks Gilson & Lione (57) ABSTRACT

Provided is a temperature compensation circuit capable of solely and independently adjusting a temperature compensation amount. The temperature compensation circuit includes: a first temperature compensation voltage terminal connected to a node between a first resistor and a second resistor; a second temperature compensation voltage terminal connected to a node between a third resistor and a fourth resistor; a first voltage terminal formed at a node between the first resistor and the fourth resistor; a second voltage terminal formed at a node between the second resistor and the third resistor; a fifth resistor connected between a power supply terminal and the first voltage terminal; and a sixth resistor connected between a ground terminal and the second voltage terminal.

10 Claims, 8 Drawing Sheets

(56) References Cited

U.S. PATENT DOCUMENTS

| | | | |
|---|---|---|---|
| 8,106,646 B2 | 1/2012 | Ariyama | |
| 8,901,966 B2 * | 12/2014 | Yoshikawa | H03K 5/2481 |
| | | | 327/52 |
| 9,664,752 B2 * | 5/2017 | Monreal | G01R 33/07 |
| 2002/0083776 A1 * | 7/2002 | Tanizawa | G01D 3/0365 |
| | | | 73/753 |
| 2008/0088258 A1 | 4/2008 | Sakaguchi | |
| 2008/0088268 A1 * | 4/2008 | Sakaguchi | F04D 27/004 |
| | | | 318/471 |

* cited by examiner

TEMPERATURE COMPENSATION CIRCUIT AND SENSOR DEVICE

RELATED APPLICATIONS

This application claims priority under 35 U.S.C. § 119 to Japanese Patent Application No. 2015-112309 filed on Jun. 2, 2015, the entire content of which is hereby incorporated by reference.

BACKGROUND OF THE INVENTION

1. Field of the Invention

The present invention relates to a temperature compensation circuit and a sensor device, and more particularly, to a circuit configured to perform temperature compensation of the sensitivity of a sensor element.

2. Description of the Related Art

These days, various kinds of sensor devices are mounted on electronic apparatus and are utilized. For example, a magnetic sensor device is mounted on an electronic apparatus and a magnet is provided on a lid or a cover thereof When the lid or the cover is away from the electronic apparatus, the electronic apparatus provides normal operation, and, when the lid or the cover is close to the electronic apparatus, the electronic apparatus operates to shift to a power saving mode. The magnetic sensor device is configured to determine whether the lid or the cover is away from or close to the electronic apparatus using change in density of a magnetic flux from the magnet and output signals indicating whether the density of the applied magnetic flux is below or above a predetermined value so that the signals can be transferred to the electronic apparatus. In this case, it is ideal that an output signal from the sensor device is constant when the temperature changes. However, an output signal of a sensor element itself included in the sensor device depends on the temperature, and thus, it is required to mount, on the sensor device, a temperature compensation circuit for compensating for the temperature dependence of the sensor element.

Figure 10:
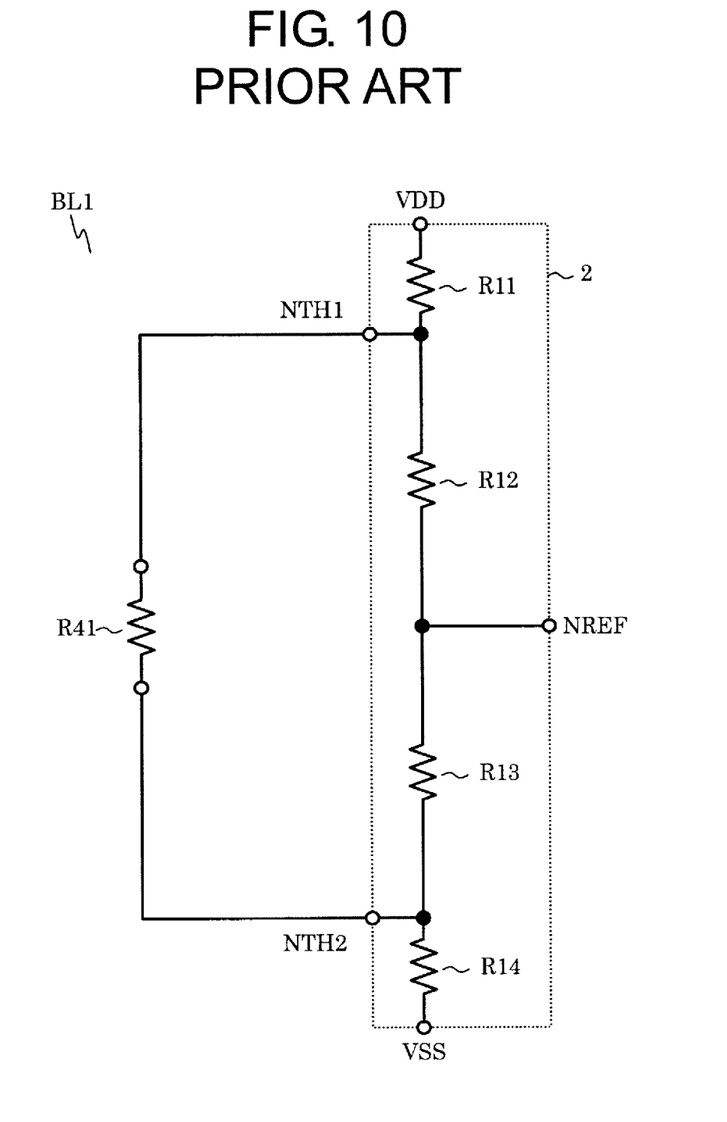
FIG. 10 is a circuit diagram of a related-art temperature compensation circuit.

FIG. 10 is an exemplary circuit diagram of a related-art temperature compensation circuit. A related-art temperature compensation circuit BL1 includes resistors R11 to R14 that are connected in series in this order between a power supply terminal VDD and a ground terminal VSS, and a resistor R41. A first reference voltage VTH1 is output from a first output terminal NTH1 that is a node between the resistor R11 and the resistor R12, a reference voltage VREF is output from a reference voltage terminal NREF that is a node between the resistor R12 and the resistor R13, and a second reference voltage VTH2 is output from a second output terminal NTH2 that is a node between the resistor R13 and the resistor R14. The resistor R41 is connected between the first output terminal NTH1 and the second output terminal NTH2.

With regard to the resistors R11 to R14, the resistors R11 and R14 have the same resistance value, the resistors R12 and R13 have the same resistance value, and the resistance values of the resistors R11 to R14 have the same temperature coefficient. The resistance value of the resistor R41 has a temperature coefficient that is different from the temperature coefficient of the resistance values of the resistors R11 to R14. Here, for the sake of convenience of description, the temperature coefficient of the resistance values of the resistors R11 to R14 is assumed to be larger than the temperature coefficient of the resistance value of the resistor R41. Then, the following expressions are established.

$$VTH1 - VREF = VDD \times \frac{RX/R11}{2 \times (2 + RX/R11)} \quad (A1)$$

$$VTH2 - VREF = -VDD \times \frac{RX/R11}{2 \times (2 + RX/R11)} \quad (A2)$$

$$VREF = \frac{VDD}{2} \quad (A3)$$

In this case, the voltage at the ground terminal VSS is assumed to be zero. Further, RX is a resistance value between the first output terminal NTH1 and the second output terminal NTH2 and is expressed by the following expression.

$$RX = \frac{2 \times 4R11 \times R41}{2 \times R11 + R41} \quad (A4)$$

By substituting Expression (A4) into Expression (A1) and Expression (A2), the following expressions are obtained.

$$VTH1 - VREF = +VDD \times \frac{1}{4 \cdot (R11/R41 + 1)} \quad (A5)$$

$$VTH2 - VREF = -VDD \times \frac{1}{4 \cdot (R11/R41 + 1)} \quad (A6)$$

Figure 11:
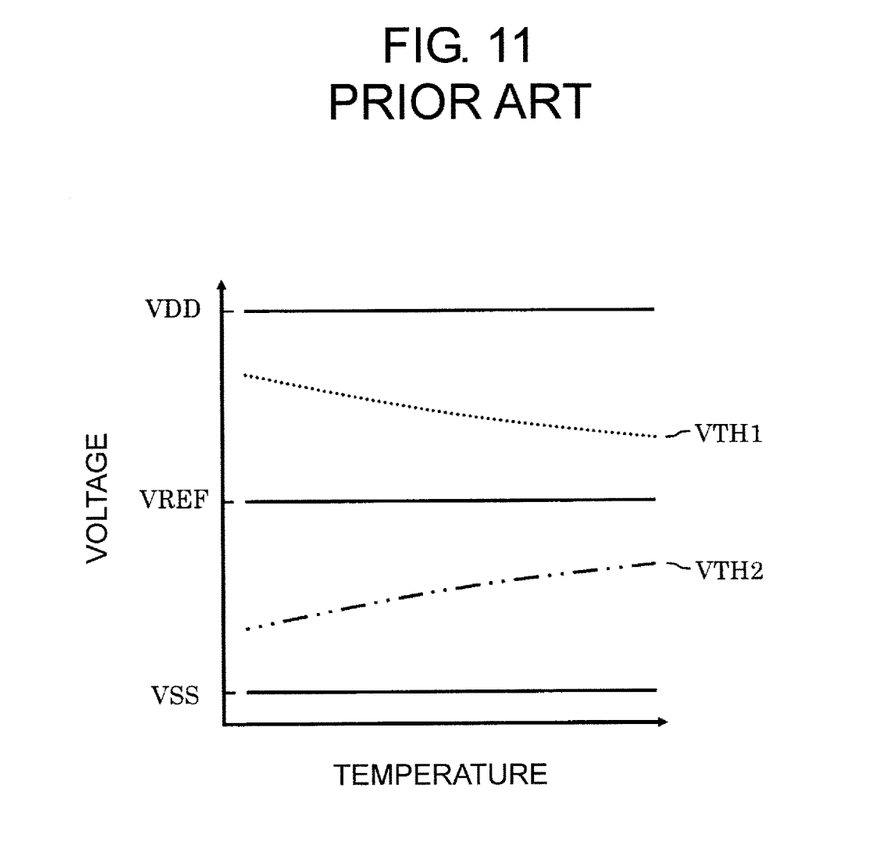
FIG. 11 is a graph for showing temperature dependence of a reference voltage in the related-art temperature compensation circuit.

As the temperature becomes higher, the resistance value of the resistor R41 becomes smaller with respect to the resistance value of the resistor R11, and thus, the term R11/R41 becomes larger as the temperature becomes higher. As shown in FIG. 11, (VTH1−VREF) becomes smaller as the temperature becomes higher. (VREF−VTH2) also becomes smaller as the temperature becomes higher. As described above, through allowing the reference voltage to be temperature dependent and fitting the temperature coefficient of the reference voltage to the temperature coefficient of the sensor element, output of the sensor device becomes constant when the temperature changes and hence highly precise output without temperature dependence can be achieved. Further, through adjusting the resistance values of the resistor R41 and of the resistors R11 to R14 to adjust the ratio of the resistance values among the resistors having different temperature coefficients, the temperature compensation amount can be adjusted. Thus, a temperature compensation circuit applicable to a wide range of sensor devices or semiconductor devices can be achieved with a small circuit scale.

However, in the related-art temperature compensation circuit, not only the temperature compensation amount but also the compensation amount at a certain reference temperature changes, and thus, there is a problem in that a resistance value range in which both an optimum compensation amount at the reference temperature and an optimum temperature compensation amount can be attained is narrow, and a range in which the temperature compensation circuit can be used is limited. In other words, there is a problem in that the temperature compensation amount cannot be solely and independently adjusted.

SUMMARY OF THE INVENTION

In order to solve the related-art problems as described above, a temperature compensation circuit according to one embodiment of the present invention has the following configuration.

The temperature compensation circuit includes: at least six resistors of a first resistor to a sixth resistor; a first output terminal connected to a node between the first resistor and the second resistor; a second output terminal connected to a node between the third resistor and the fourth resistor; a first voltage terminal formed at a node between the first resistor and the fourth resistor; and a second voltage terminal formed at a node between the second resistor and the third resistor, the fifth resistor being connected between a power supply terminal and the first voltage terminal, the sixth resistor being connected between a ground terminal and the second voltage terminal, in which a resistance value of at least one of the first resistor to the fourth resistor has a temperature coefficient that is different from a temperature coefficient of a resistance value of another of the first resistor to the fourth resistor, and in which the resistance value of the at least one of the first resistor to the fourth resistor is adjusted so that a temperature compensation voltage that is output from the first output terminal and a temperature compensation voltage that is output from the second output terminal is equal to each other at a predetermined temperature.

According to the temperature compensation circuit of the present invention, through effectively using the resistors having different temperature coefficients, a temperature compensation circuit that can adjust only the temperature coefficient and that can adjust the temperature compensation amount can be achieved with a relatively small circuit scale.

DETAILED DESCRIPTION OF THE PREFERRED EMBODIMENTS

A temperature compensation circuit according to the present invention can be widely used as a temperature compensation circuit in a semiconductor circuit. The temperature compensation circuit according to the present invention is described in the following with reference to the attached drawings.

<First Embodiment22

Figure 1:
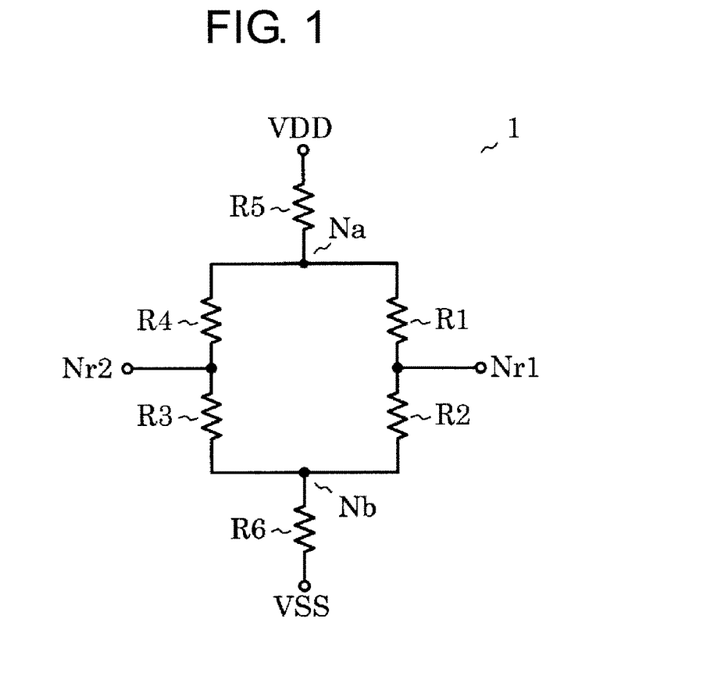
FIG. 1 is a circuit diagram of a temperature compensation circuit according to a first embodiment of the present invention.

FIG. 1 is a circuit diagram of a temperature compensation circuit according to a first embodiment of the present invention. A temperature compensation circuit 1 according to the first embodiment includes resistors R1 to R6.

A first output terminal Nr1 is connected to a node between the resistor R1 and the resistor R2. A second output terminal Nr2 is connected to a node between the resistor R3 and the resistor R4. A first voltage terminal Na is formed at a node between the resistor R1 and the resistor R4, and a second voltage terminal Nb is formed at a node between the resistor R2 and the resistor R3. The resistor R5 is connected between a power supply terminal VDD and the first voltage terminal Na, and the resistor R6 is connected between a ground terminal VSS and the second voltage terminal Nb.

Voltages at the first output terminal Nr1, at the second output terminal Nr2, at the first voltage terminal Na, and at the second voltage terminal Nb are represented by Vr1, Vr2, Va, and Vb, respectively. Vr1 and Vr2 are calculated by the following expressions.

$$Vr1 = \frac{R2 \times Va + R1 \times Vb}{R1 + R2} \quad (1)$$

$$Vr2 = \frac{R3 \times Va + R4 \times Vb}{R3 + R4} \quad (2)$$

When a difference between Vr1 and Vr2 is represented by a temperature compensation voltage $\Delta Vr$, the temperature compensation voltage $\Delta Vr$ is expressed by the following expression.

$$\Delta Vr = Vr1 - Vr2 = \frac{R2 \times R4 - R1 \times R3}{(R1 + R2) \times (R3 + R4)} \times (Va - Vb) \quad (3)$$

At least one resistor of the resistors R1 to R4 has a temperature coefficient that is different from a temperature coefficient of the resistance value of another of the resistors.

Figure 2:
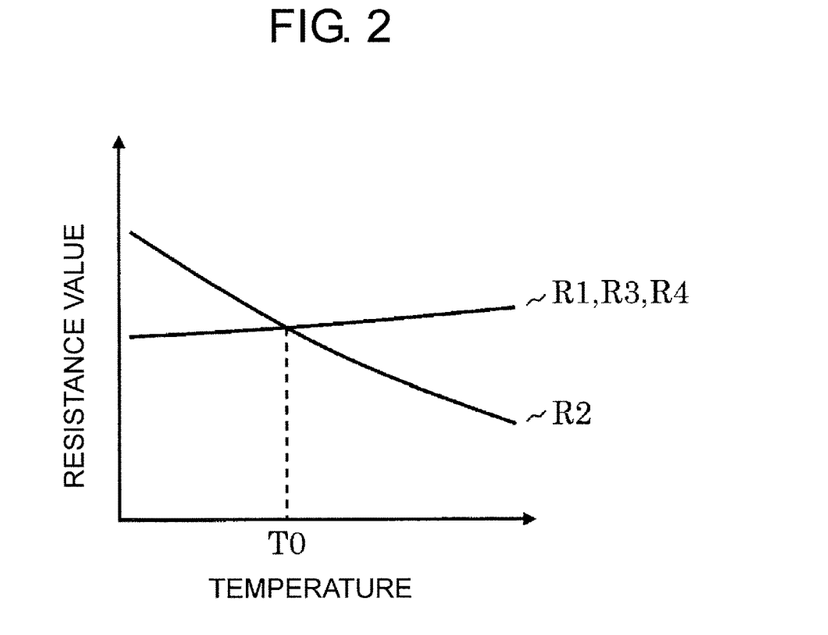
FIG. 2 is a graph for showing temperature dependence of resistors used in the first embodiment.

FIG. 2 is a graph for showing temperature dependence of the resistance values of the resistors R1 to R4 used in the first embodiment. For the sake of convenience of description, as an example, it is assumed that the resistance values of the resistors R1, R3, and R4 are equal to one another, the temperature coefficients of the respective resistance values are equal to one another, and the temperature coefficient of the resistance value of the resistor R2 is different from, in particular, smaller than, the temperature coefficient of the resistance values of the resistors R1, R3, and R4. The temperature coefficient of the resistance values of the resistors R1, R3, and R4 is referred to as a first temperature coefficient, while the temperature coefficient of the resistance value of the resistor R2 is referred to as a second temperature coefficient. It is further assumed that, at a certain temperature T0, the resistance value of the resistor R1 and the resistance value of the resistor R2 are equal to each other. Then, from Expression (3), the temperature compensation voltage $\Delta Vr$ is expressed as follows.

$$\Delta Vr = \frac{1}{2} \times \frac{\alpha - 1}{\alpha + 1} \times (Va - Vb) \quad (4)$$

In Expression (4), α is a ratio between the resistance value of the resistor R2 and the resistance value of the resistor R1, that is, α=R2/R1. At the temperature T0, the resistance value of the resistor R1 and the resistance value of the resistor R2 are equal to each other and α=1, and thus, the temperature compensation voltage ΔVr is zero. At a temperature higher than the temperature T0, the resistance value of the resistor R2 is smaller than the resistance value of the resistor R1, that is, α<1, and thus, the temperature compensation voltage ΔVr is a negative value. At a temperature lower than the temperature T0, the resistance value of the resistor R2 is larger than the resistance value of the resistor R1, that is, α>1, and thus, the temperature compensation voltage ΔVr is a positive value. This is shown in FIG. 3.

Figure 3:
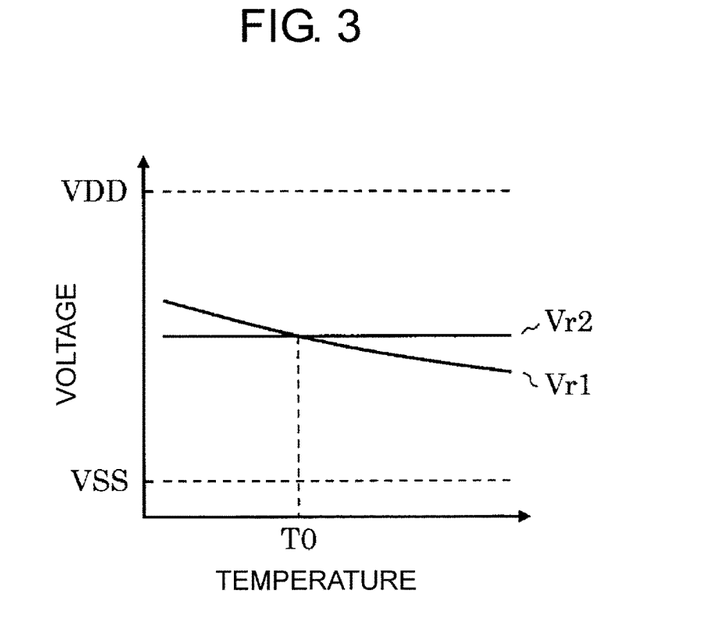
FIG. 3 is a graph for showing temperature dependence of an output voltage according to the first embodiment.

FIG. 3 is a graph for showing temperature dependence of an output voltage according to the first embodiment. At the temperature T0, ΔVr=Vr1−Vr2=0, and thus, Vr1=Vr2. At a temperature higher than the temperature T0, ΔVr=Vr1−Vr2<0, and thus, Vr1<Vr2. At a temperature lower than the temperature T0, ΔVr=Vr1−Vr2>0, and thus, Vr1>Vr2.

Further, the temperature compensation voltage ΔVr at a temperature other than the temperature T0 varies, as expressed by Expression (4), depending on α=R2/R1, that is, the resistance values of the resistors R1 and R2. As described above, the resistance values of the resistors R1 and R2 are adjusted so as to be equal to each other at the temperature T0, and thus, it is difficult to adjust the resistance values at a temperature other than the temperature T0. The resistor R5 and the resistor R6 are formed for the purpose of adjusting the temperature compensation voltage ΔVr.

As expressed by Expression (4), the temperature compensation voltage ΔVr varies depending on the value of (Va−Vb). In the following, (Va−Vb) is calculated. When a current flowing through the resistor R5 and a current flowing through the resistor R6 are represented by I5 and I6, respectively, I5 and I6 are expressed by the following expressions.

$$I5 = \frac{VDD - Va}{R5} \quad (5)$$

$$I6 = \frac{Vb - VSS}{R6} \quad (6)$$

When the above expressions are deformed to determine Va and Vb, and further, Va−Vb, the following expressions are obtained.

$$Va = VDD - I5 \cdot R5 \quad (7)$$

$$Vb = VSS - I6 \cdot R6 \quad (8)$$

$$Va - Vb = (VDD - VSS) - I5 \cdot R5 + I6 \cdot R6 \quad (9)$$

Because of the circuit configuration, the current I5 and the current I6 are equal to each other, and thus, Expression (9) is expressed as follows.

$$Va - Vb = (VDD - VSS) - I5 \cdot (R5 + R6) \quad (10)$$

Here, when a resistor equivalent to the resistors R1 to R4 is represented by Ra and a resistor equivalent to the resistors R1 to R6 is represented by Rt, the resistance values of the equivalent resistor Ra and the equivalent resistor Rt are expressed by the following expressions.

$$Ra = \frac{(R1 + R2) \times (R3 + R4)}{(R1 + R2) + (R3 + R4)} \quad (11)$$

$$Rt = R5 + R6 + Ra \quad (12)$$

Because of the circuit configuration, a current flowing through the resistor R5 and a current flowing through the equivalent resistor Rt are equal to each other, and thus the following expression is established.

$$I5 = \frac{VDD - VSS}{Rt} \quad (13)$$

When Expression (13) is substituted into Expression (10), the following expression is obtained.

$$Va - Vb = \left(1 - \frac{R5 + R6}{Rt}\right) \times (VDD - VSS) \quad (14)$$

When Expression (14) is substituted into Expression (12), the following expression is obtained.

$$Va - Vb = \frac{Ra}{R5 + R6 + Ra} \times (VDD - VSS) \quad (15)$$

Further, Expression (15) is deformed to obtain the following expression.

$$Va - Vb = \frac{1}{1 + \frac{R5 | R6}{Ra}} \times (VDD - VSS) \quad (16)$$

When Expression (11) is substituted into Expression (16), the following expression is obtained.

$$Va - Vb = \frac{1}{1 + (R5 + R6) \times \frac{(R1 + R2) + (R3 + R4)}{(R1 - R2) \times (R3 + R4)}} \times (VDD - VSS) \quad (17)$$

Therefore, as the resistance values of the resistors R5 and R6 become larger, (Va−Vb) becomes smaller, and the temperature compensation voltage ΔVr expressed by Expression (3) or Expression (4) becomes smaller. In other words, through setting the resistance values of the resistor R5 and the resistor R6 to be arbitrary values, (Va−Vb) can be arbitrarily adjusted, and thus, the temperature compensation voltage ΔVr expressed by Expression (3) or Expression (4) can be arbitrarily adjusted. On the other hand, no matter what resistance values the resistor R5 and the resistor R6 have, the temperature compensation voltage ΔVr is zero at the temperature T0, and thus, the temperature compensation circuit according to this embodiment can solely and independently adjust the temperature compensation amount.

Operation of the temperature compensation circuit according to the first embodiment of the present invention is described above. Through effectively utilizing the resistors having different temperature coefficients, a temperature compensation circuit that can adjust only the temperature coefficient and that can adjust the temperature compensation amount can be achieved with a relatively small circuit scale.

In this description, an exemplary relationship between the resistance values of the resistors R1 to R4 and the temperature dependence of the resistance values is described, but the relationship among the resistors is not limited thereto insofar as the configuration is as described herein. For example, the temperature coefficient of the resistance value of the resistor R1 may be different from that of the resistors R2 to R4, or the temperature coefficient of the resistance value of the resistor R3 may be different from that of the resistors R1, R2, and R4. Alternatively, the temperature coefficient of the resistance values of the resistors R1 and R3 may be equal to each other and the resistors R2 and R4 having a temperature coefficient of the resistance values that is different from that of the resistors R1 and R3 may be used. For the sake of description, the resistance values of the resistor R1 and the resistor R3 are equal to each other, the resistance values of the resistor R2 and the resistor R4 are equal to each other, and the ratio of the resistance values between the resistors R2 and R1 is represented by α, that is, α=R2/R1. From Expression (3), the temperature compensation voltage ΔVr is expressed by the following expression.

$$\Delta Vr = \frac{\alpha - 1}{\alpha + 1} \times (Va - Vb) \qquad (18)$$

The right side of Expression (18) is twice as large as the right side of Expression (4). Therefore, the temperature compensation voltage ΔVr is twice as large as that described with Expression (4). On the other hand, the temperature compensation voltage ΔVr is zero at the temperature T0. Therefore, the temperature compensation circuit has the characteristics of the temperature compensation circuit described above. Further, in the above description, R1=R2 is a condition for the temperature compensation voltage ΔVr to be zero at the temperature T0, but the present invention is not limited thereto. It is enough that resistance values are selected so that the numerator in the fraction part in Expression (3) may be zero. Specifically, it is enough that the resistance values are selected so that R2×R4=R1×R3 may be satisfied.

<Second Embodiment>

Figure 4:
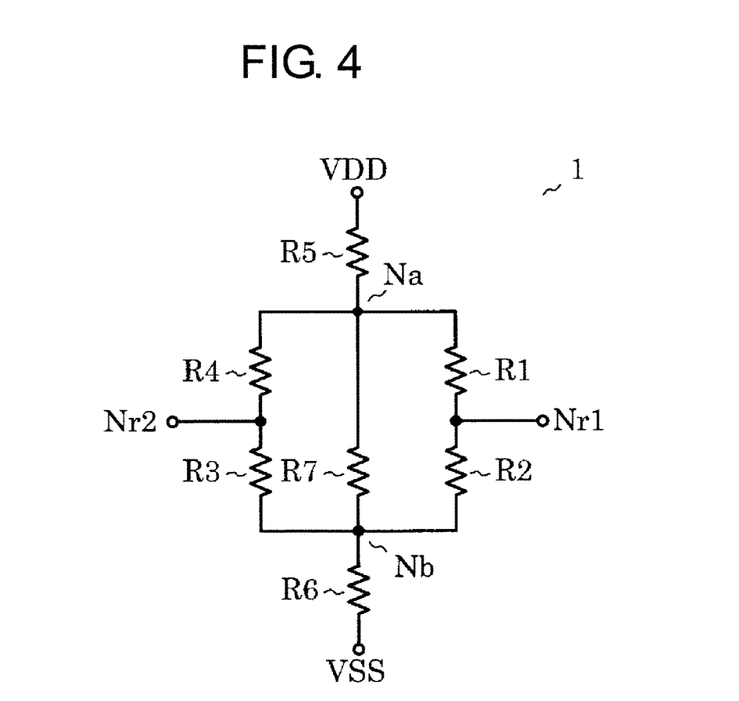
FIG. 4 is a circuit diagram of a temperature compensation circuit according to a second embodiment of the present invention.

FIG. 4 is a circuit diagram of a temperature compensation circuit according to a second embodiment of the present invention. The second embodiment is different from the first embodiment illustrated in FIG. 1 in that a resistor R7 is added. The added resistor R7 is connected between the first voltage terminal Na and the second voltage terminal Nb. Through adding the resistor R7, a resistor Ra' equivalent to the resistors R1 to R4 and the resistor R7 is expressed by the following expression.

$$Ra' = \frac{R7}{R7 + Ra} \times Ra \qquad (19)$$

Here, Ra is the same as the resistor Ra equivalent to the resistors R1 to R4 expressed by Expression (11) in the first embodiment. Further, when a resistor equivalent to the resistors R1 to R7 is represented by Rt', the equivalent resistor Rt is expressed by the following expression.

$$Rt' = R5 + R6 + Ra' \qquad (20)$$

Similarly to the process of deriving Expression (17) from Expression (13) according to the first embodiment, (Va−Vb) is determined as in the following expressions.

Because of the circuit configuration, a current flowing through the resistor R5 and a current flowing through the equivalent resistor Rt' are equal to each other, and thus the following expression is established.

$$I5 = \frac{VDD - VSS}{Rt'} \qquad (21)$$

When Expression (21) is substituted into Expression (10), the following expression is obtained.

$$Va - Vb = \left(1 - \frac{R5 + R6}{Rt'}\right) \times (VDD - VSS) \qquad (22)$$

When Expression (20) is substituted into Expression (22), the following expression is obtained.

$$Va - Vb = \frac{Ra'}{R5 + R6 + Ra'} \times (VDD - VSS) \qquad (23)$$

Further, Expression (23) is deformed to obtain the following expression.

$$Va - Vb = \frac{1}{1 + \frac{R5 + R6}{Ra'}} \times (VDD - VSS) \qquad (24)$$

When Expression (19) is substituted into Expression (24), the following expression is obtained.

$$Va - Vb = \frac{1}{1 + \frac{R5 + R6}{Ra} \times \left(1 + \frac{Ra}{R7}\right)} \times (VDD - VSS) \qquad (25)$$

When the above expression is compared with Expression (16) determined in the first embodiment, a term (1+Ra/R7) is added to the denominator. Specifically, adding the resistor R7 reduces the value of (Va−Vb). As the resistance value of the resistor R7 becomes smaller, (Va−Vb) becomes smaller, and the temperature compensation voltage ΔVr expressed by Expression (3) or Expression (4) becomes smaller. In other words, through setting the resistance value of the resistor R7 to be an arbitrary value, (Va−Vb) can be arbitrarily adjusted, and thus, the temperature compensation voltage ΔVr expressed by Expression (3) or Expression (4) can be arbitrarily adjusted. On the other hand, no matter what resistance value the resistor R7 has, the temperature compensation voltage ΔVr is zero at the temperature T0, and thus, the temperature compensation circuit according to this embodiment can solely and independently adjust the temperature compensation amount. Further, through setting the temperature coefficient of the resistance value of the resistor R7 so as to be different from the temperature coefficient of the resistance value of the equivalent resistor Ra, (Va−Vb) can also be temperature dependent, and thus, the temperature compensation voltage ΔVr can be adjusted with more flexibility.

Operation of the temperature compensation circuit according to the second embodiment of the present invention is described above. Through effectively utilizing the resistors having different temperature coefficients, a temperature compensation circuit that can adjust only the temperature coefficient and that can adjust the temperature compensation amount can be achieved with a relatively small circuit scale.

<Third Embodiment>

Figure 5:
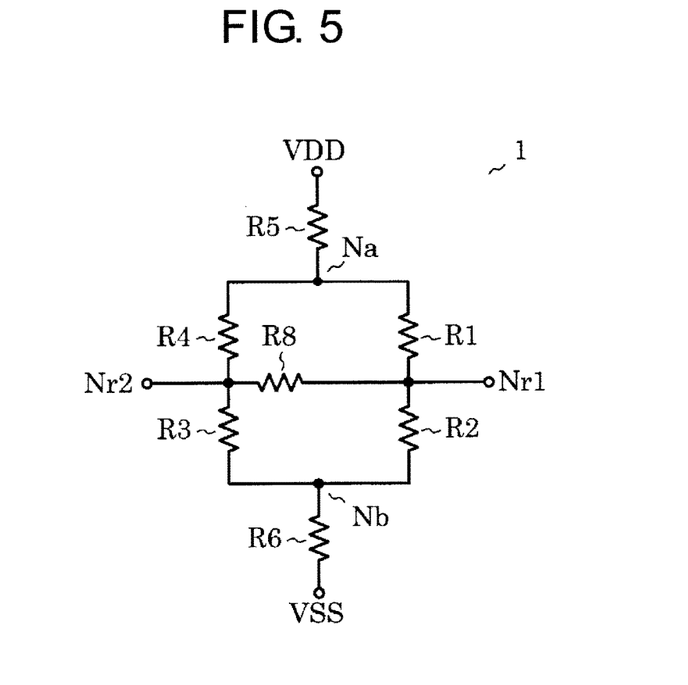
FIG. 5 is a circuit diagram of a temperature compensation circuit according to a third embodiment of the present invention.

FIG. 5 is a circuit diagram of a temperature compensation circuit according to a third embodiment of the present invention. The third embodiment is different from the first embodiment illustrated in FIG. 1 in that a resistor R8 is added. The added resistor R8 is connected between the first output terminal Nr1 and the second output terminal Nr2. A voltage Vr1' at the first output terminal Nr1, a voltage Vr2' at the second output terminal Nr2, and a temperature compensation voltage ΔVr' in this embodiment are calculated as follows. When currents flowing through the resistors R1 to R4 and R8 are represented by I1 to I14 and I8, respectively, the relationships of the respective currents are expressed by the following expressions.

$$I1 = \frac{Va - Vr1'}{R1} \quad (26)$$

$$I2 = \frac{Vr1' - Vb}{R2} \quad (27)$$

$$I3 = \frac{Vr2' - Vb}{R3} \quad (28)$$

$$I4 = \frac{Va - Vr2'}{R4} \quad (29)$$

$$I8 = \frac{Vr2' - Vr1'}{R8} \quad (30)$$

$$I4 = I3 + I8 \quad (31)$$

$$I2 = I1 + I8 \quad (32)$$

From Expression (26) to Expression (32), the temperature compensation voltage ΔVr'=Vr1'−Vr2' is calculated as follows.

$$\Delta Vr' = \frac{R2 \times R4 - R1 \times R3}{(R1+R2) \times (R3+R4)} \times (Va - Vb) \times \frac{1}{1 + \frac{1}{R8} \times \left(\frac{R1 \times R2}{R1+R2} + \frac{R3 \times R4}{R3+R4}\right)} \quad (33)$$

The intermediate steps are omitted. The relationship between the temperature compensation voltage ΔVr' according to this embodiment expressed by Expression (33) and the temperature compensation voltage ΔVr of the temperature compensation circuit according to the first embodiment expressed by Expression (3) is expressed by the following expression.

$$\Delta Vr' = \Delta Vr \times \frac{1}{1 + \frac{1}{R8} \times \left(\frac{R1 \times R2}{R1+R2} - \frac{R3 \times R4}{R3+R4}\right)} \quad (34)$$

Specifically, addition of the resistor R8 reduces the value of the temperature compensation voltage ΔVr'. In other words, through setting the resistance value of the resistor R8, the temperature compensation voltage ΔVr' can be arbitrarily adjusted. On the other hand, no matter what resistance value the resistor R8 has, the temperature compensation voltage ΔVr' is zero at the temperature T0, and thus, the temperature compensation circuit according to this embodiment can solely and independently adjust the temperature compensation amount. Further, through setting the temperature coefficient of the resistance value of the resistor R8 so as to be the same as the temperature coefficient of the resistance value of the at least one resistor of the resistors R1 to R4, or so as to be the same as the temperature coefficient of the resistance value of a resistor other than the at least one resistor of the resistors R1 to R4, and by the magnitude of the resistance value of the resistor R8, the temperature coefficient of the temperature compensation voltage ΔVr' can be changed. Thus, the temperature compensation voltage ΔVr can be adjusted with more flexibility.

Operation of the temperature compensation circuit according to the third embodiment of the present invention is described above. Through effectively using the resistors having different temperature coefficients, a temperature compensation circuit that can adjust only the temperature coefficient and that can adjust the temperature compensation amount can be achieved with a relatively small circuit scale.

<Application Example of Temperature Compensation Circuit according to the Present Invention>

Figure 6:
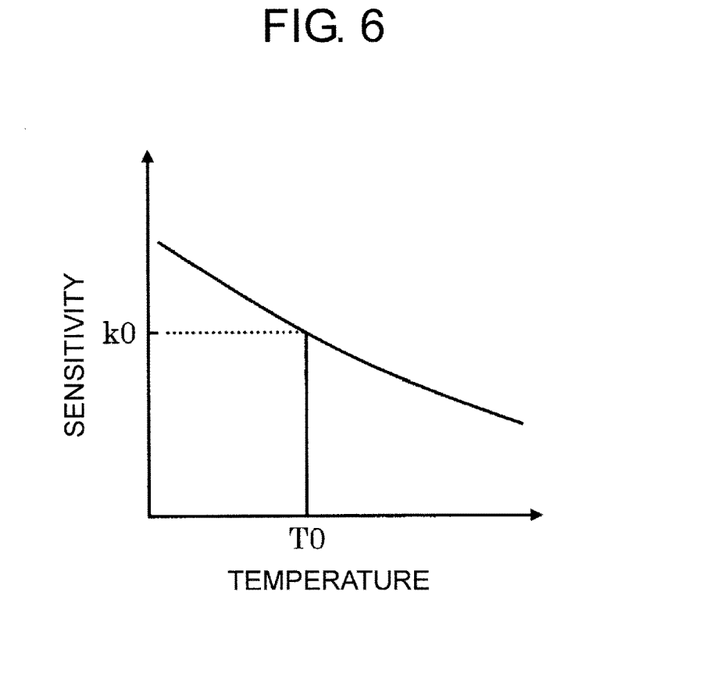
FIG. 6 is a graph for showing temperature dependence of sensitivity of a sensor element.
Figure 7:
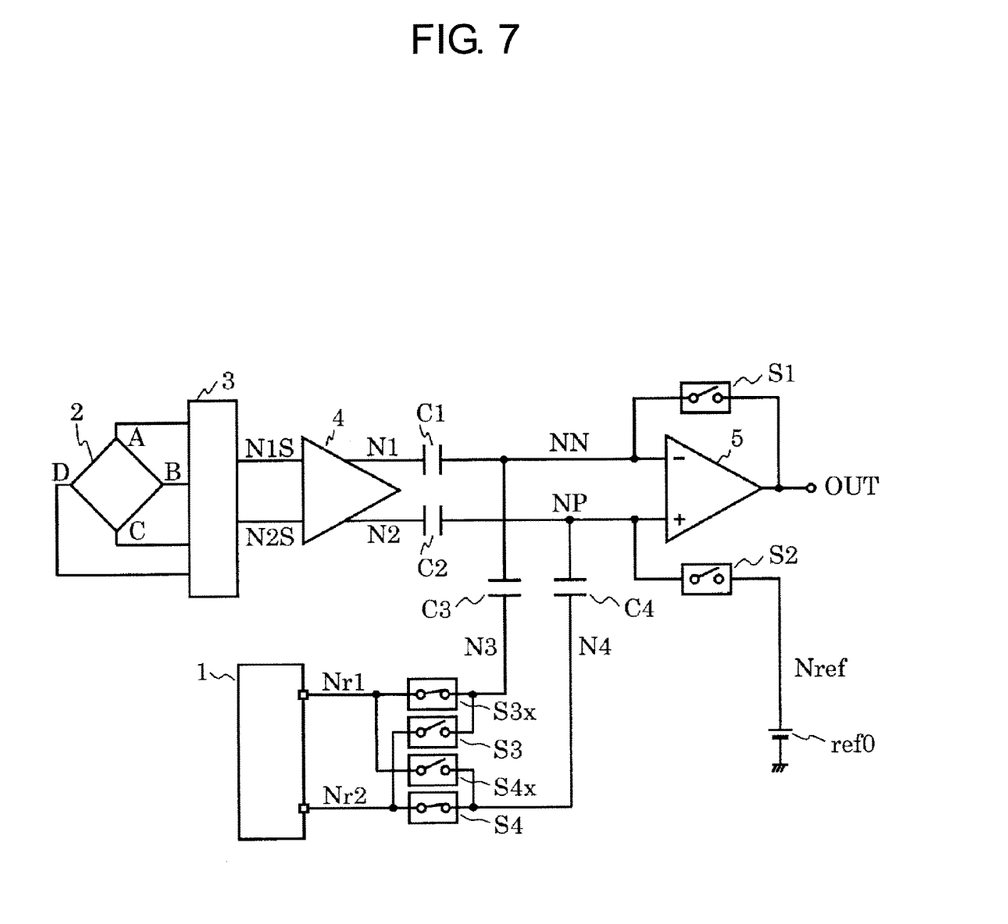
FIG. 7 is a circuit diagram of a case in which the temperature compensation circuit according to the present invention is applied to a magnetic sensor device.
Figure 8:
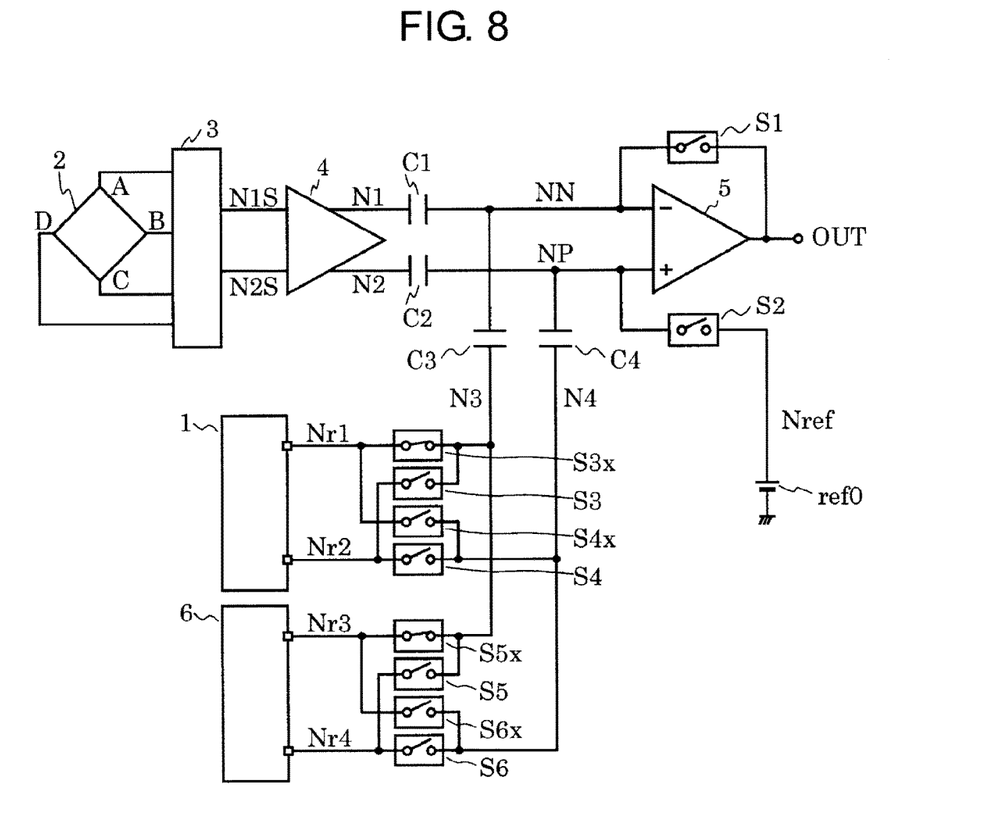
FIG. 8 is a circuit diagram of another case in which the temperature compensation circuit according to the present invention is applied to a magnetic sensor device.

FIG. 6 is a graph for showing temperature dependence of sensitivity of a sensor element. As an example, temperature dependence of sensitivity of a Hall element, which is an example of a magnetic sensor, is shown. The sensitivity of a Hall element is generally in proportion to the mobility, and thus, as the temperature becomes higher, the sensitivity becomes lower. When the sensitivity at the predetermined temperature T0 is represented by k0, the sensitivity is lower than k0 at a temperature higher than the predetermined temperature T0, and the sensitivity is higher than k0 at a temperature lower than the predetermined temperature T0. Output of a sensor device having a sensor element mounted thereon is required not to change or to change only by a small amount when the temperature changes, and thus, a circuit configured to compensate for the temperature dependence of the sensor element is required for the sensor device. The temperature compensation circuit according to the present invention is suitable for such a case. FIG. 7 and FIG. 8 are illustrations of cases in which the temperature compensation circuit according to the present invention is applied to a sensor device.

FIG. 7 is a circuit diagram of a case in which the temperature compensation circuit according to the present invention is applied to a magnetic sensor device. A signal from a Hall element 2 serving as a magneto-electric conversion element is input to a differential amplifier 4 via a switch circuit 3. The differential amplifier 4 amplifies the input signal, and the amplified signal is input to a comparator 5 via capacitors C1 and C2. The comparator 5 compares a difference between voltages respectively supplied to a terminal N1 and a terminal N2 and a difference between voltages respectively supplied to a terminal N3 and a terminal N4, based on signals responsive to a density of an applied magnetic flux, that is, output of the Hall element 2, and outputs whether the density of the applied magnetic flux is larger or smaller than a predetermined magnetic flux density. The switch circuit 3, switches S1 and S2, capacitors C1 to C4, and a reference voltage ref0 are used for the purpose of removing an error component of the Hall element 2, the differential amplifier 4, and the comparator 5 to obtain a highly accurate comparison result. As shown in FIG. 6, the sensitivity of the Hall element 2 is temperature dependent, and thus, when the difference between the voltages supplied to the terminal N3 and the terminal N4, respectively, is constant when the temperature changes, the output of the comparator 5, that is, the output of the magnetic sensor device is an output that is not constant when the temperature changes, and is temperature dependent. For the purpose of compensating for the temperature dependence of the Hall element 2, the first output terminal Nr1 and the second output terminal Nr2 of the temperature compensation circuit 1 according to the present invention are connected to the terminal N3 and the terminal N4 via switches S3, S3x, S4, and S4x to supply the temperature compensation voltage ΔVr or ΔVr', thereby enabling obtainment of output of the magnetic sensor device without temperature dependence.

FIG. 8 is a circuit diagram of another case in which the temperature compensation circuit according to the present invention is applied to a magnetic sensor device. The magnetic sensor device of FIG. 8 is different from the magnetic sensor device illustrated in FIG. 7 in that a reference voltage circuit 6 and switches S5, S5x, S6, and S6x are added. An output terminal Nr3 and an output terminal Nr4 of the reference voltage circuit 6 are connected to the terminal N3 and the terminal N4 via the switches S5, S5x, S6, and S6x to supply a reference voltage ΔVref without temperature dependence. Therefore, the compensation amount at the predetermined temperature T0 can be supplied by the reference voltage circuit 6 and the temperature compensation amount can be supplied by the temperature compensation circuit 1. In other words, output of the magnetic sensor device without temperature dependence can be obtained, and at the same time, a threshold level for determining whether the density of the applied magnetic flux is larger or smaller than a predetermined magnetic flux density can be adjusted.

Figure 9:
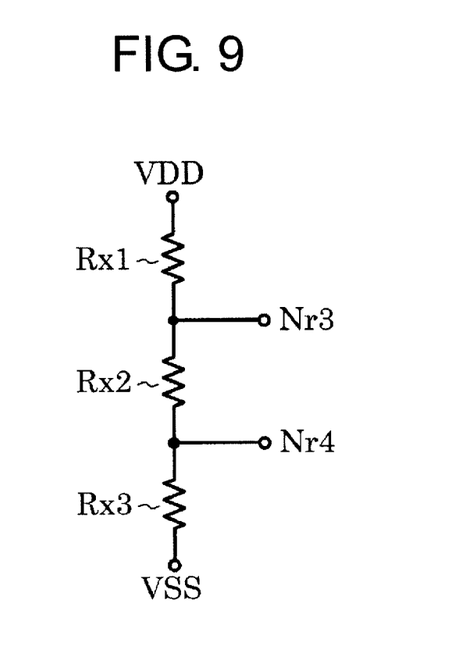
FIG. 9 is a circuit diagram for illustrating an exemplary reference voltage circuit used in a magnetic sensor device.

FIG. 9 is a circuit diagram for illustrating an example of the reference voltage circuit 6 illustrated in FIG. 8. The reference voltage circuit 6 includes resistors Rx1 to Rx3 that are connected in series between the power supply terminal VDD and the ground terminal VSS. The output terminal Nr3 is connected to a node between the resistors Rx1 and Rx2. The output terminal Nr4 is connected to a node between the resistors Rx2 and Rx3.

When voltages at the output terminal Nr3 and the output terminal Nr4 are represented by Vr3 and Vr4, respectively, and the reference voltage ΔVref=Vr3−Vr4, the following expression is obtained.

$$\Delta Vref = \frac{R \times 2}{R \times 1 + R \times 2 + R \times 3} \times (VDD - VSS) \quad (35)$$

When the resistors Rx1 to Rx3 are resistors having the same temperature coefficient, the reference voltage ΔVref is a voltage without temperature dependence. Further, through adjusting the ratio of the resistance values among the resistors Rx1 to Rx3, ΔVref can be arbitrarily adjusted.

FIG. 7 to FIG. 9 are illustrations of the cases in which the temperature compensation circuit according to the present invention is applied to a magnetic sensor device. For the sake of description, specific cases are described herein, but the present invention is not necessarily limited to the configurations and the sensor element described herein, and is applicable to a wide range of semiconductor circuits.

What is claimed is:

1. A temperature compensation circuit, comprising:
    at least six resistors of a first resistor to a sixth resistor;
    a first output terminal connected to a node between the first resistor and the second resistor;
    a second output terminal connected to a node between the third resistor and the fourth resistor;
    a first voltage terminal formed at a node between the first resistor and the fourth resistor; and
    a second voltage terminal formed at a node between the second resistor and the third resistor,
    the fifth resistor connected between a power supply terminal and the first voltage terminal,
    the sixth resistor connected between a ground terminal and the second voltage terminal,
    wherein a resistance value of at least one of the first resistor to the fourth resistor has a temperature coefficient that is different from a temperature coefficient of a resistance value of a remainder of the first resistor to the fourth resistor, and
    wherein the fifth and sixth resistors are configured to adjust a temperature compensation voltage output from the first and second output terminals, respectively, and the resistance value of the at least one of the first resistor to the fourth resistor is adjusted so that the temperature compensation voltage that is output from the first output terminal and the temperature compensation voltage that is output from the second output terminal are equal to each other at a predetermined temperature.

2. A temperature compensation circuit according to claim 1, further comprising a seventh resistor connected between the first voltage terminal and the second voltage terminal.

3. A temperature compensation circuit according to claim 1, further comprising a seventh resistor connected between the first output terminal and the second output terminal.

4. A temperature compensation circuit according to claim 1, further comprising one of:
    an additional resistor connected between the first voltage terminal and the second voltage terminal; or
    an additional resistor connected between the first output terminal and the second output terminal.

5. A sensor device configured to produce an output responsively to intensity of a physical quantity applied to a sensor element, the sensor device comprising the temperature compensation circuit of claims 1, the temperature compensation circuit being configured to compensate for a temperature coefficient of the sensor element.

6. A temperature compensation circuit, comprising:
    at least six resistors of a first resistor to a sixth resistor;
    a first output terminal connected to a node between the first resistor and the second resistor;
    a second output terminal connected to a node between the third resistor and the fourth resistor;
    a first voltage terminal formed at a node between the first resistor and the fourth resistor; and
    a second voltage terminal formed at a node between the second resistor and the third resistor,
    the fifth resistor connected between a power supply terminal and the first voltage terminal and configured to adjust a temperature compensation voltage output from the first terminal, the sixth resistor connected between a ground terminal and the second voltage terminal and configured to adjust a temperature compensation voltage output from the second terminal, wherein a resistance value of at least one of the first resistor to the fourth resistor has a temperature coefficient that is different from a temperature coefficient of a resistance value of a remainder of the first resistor to the fourth resistor, and wherein a product of a resistance value of the first resistor and a resistance value of the third resistor and a product of a resistance value of the second resistor and a resistance value of the fourth resistor are equal to each other at a predetermined temperature.

7. A temperature compensation circuit according to claim 6, further comprising a seventh resistor connected between the first voltage terminal and the second voltage terminal.

8. A temperature compensation circuit according to claim 6, further comprising a seventh resistor connected between the first output terminal and the second output terminal.

9. A temperature compensation circuit according to claim 6, further comprising one of:

an additional resistor connected between the first voltage terminal and the second voltage terminal; or an additional resistor connected between the first output terminal and the second output terminal.

10. A sensor device configured to produce an output responsively to intensity of a physical quantity applied to a sensor element, the sensor device comprising the temperature compensation circuit of claim 6, the temperature compensation circuit being configured to compensate for a temperature coefficient of the sensor element.

* * * * *